United States Patent
Ortabasi

[19]
[11] Patent Number: 5,990,413
[45] Date of Patent: Nov. 23, 1999

[54] BIFACIAL LIGHTWEIGHT ARRAY FOR SOLAR POWER

[76] Inventor: Ugur Ortabasi, 1680 Meadowglen La., Encinitas, Calif. 92024

[21] Appl. No.: 08/878,827

[22] Filed: Jun. 19, 1997

Related U.S. Application Data

[60] Provisional application No. 60/020,022, Jun. 19, 1996.

[51] Int. Cl.[6] ................................................. H01L 25/00
[52] U.S. Cl. .......................... 136/244; 136/251; 136/292
[58] Field of Search .................................. 136/244, 251, 136/292

[56] References Cited

U.S. PATENT DOCUMENTS

| | | |
|---|---|---|
| 4,293,731 | 10/1981 | Schweig et al. .................... 136/245 |
| 4,377,266 | 3/1983 | Belew et al. ......................... 244/159 |
| 4,401,710 | 8/1983 | Bansemir et al. .................. 428/229 |
| 4,680,074 | 7/1987 | Schmitz et al. ..................... 136/244 |
| 5,538,563 | 7/1996 | Finkl ...................................... 136/246 |

*Primary Examiner*—Mark Chapman
*Attorney, Agent, or Firm*—Watson Cole Grindle Watson P.L.L.C.

[57] ABSTRACT

A laminate includes bifacial solar cells that can receive and convert sunlight incident from either side. The laminate is held in a frame by high tensile cords that are strung like the cords in a tennis racket. The resulting assembly receives direct sunlight from one side and light reflected through albedo through the other side.

14 Claims, 7 Drawing Sheets

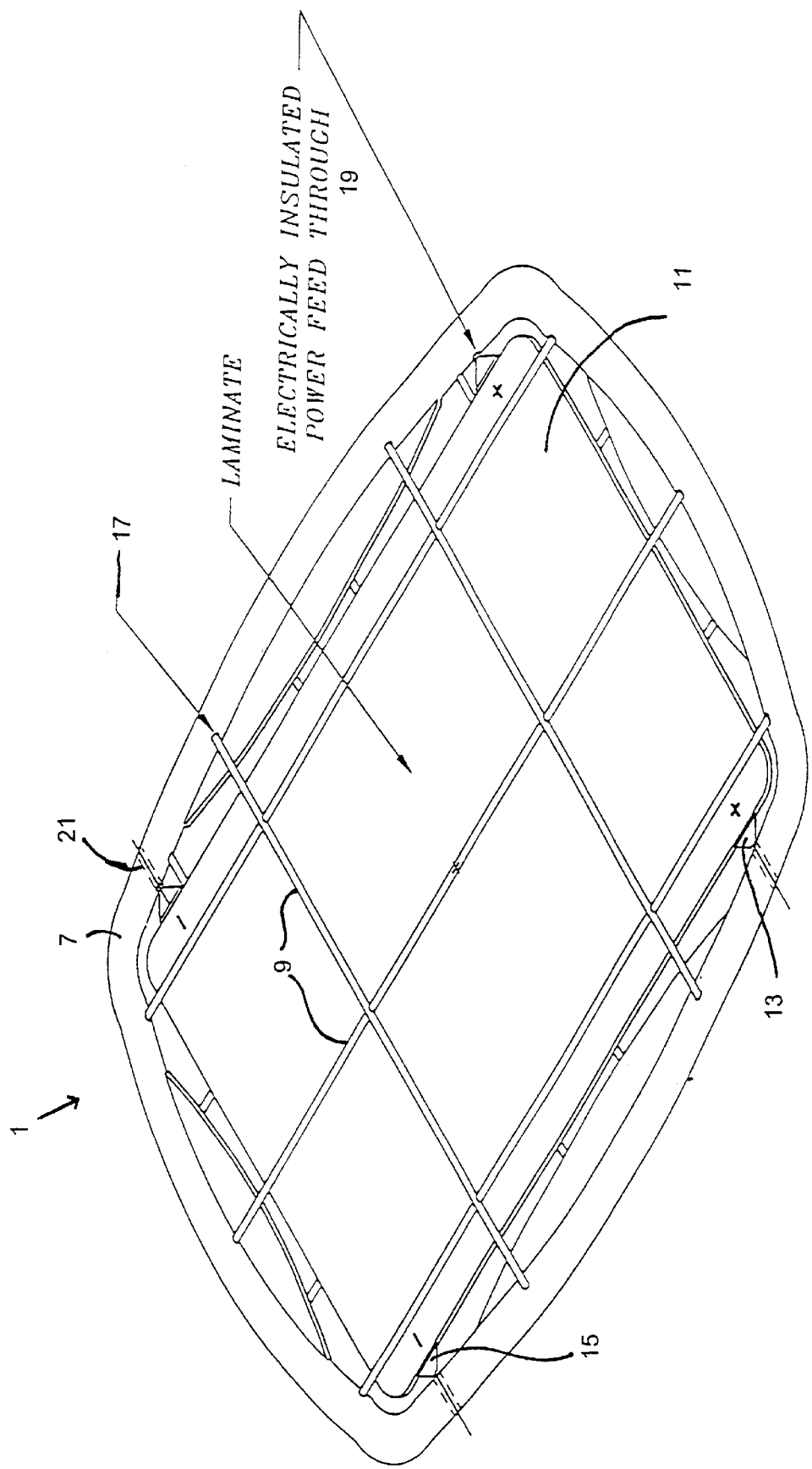

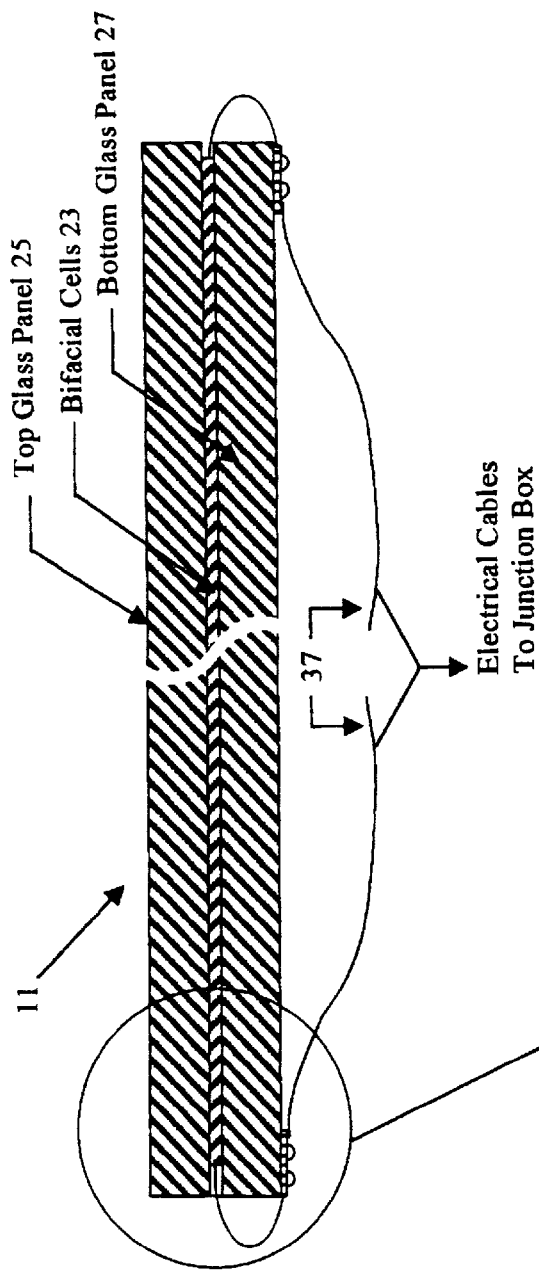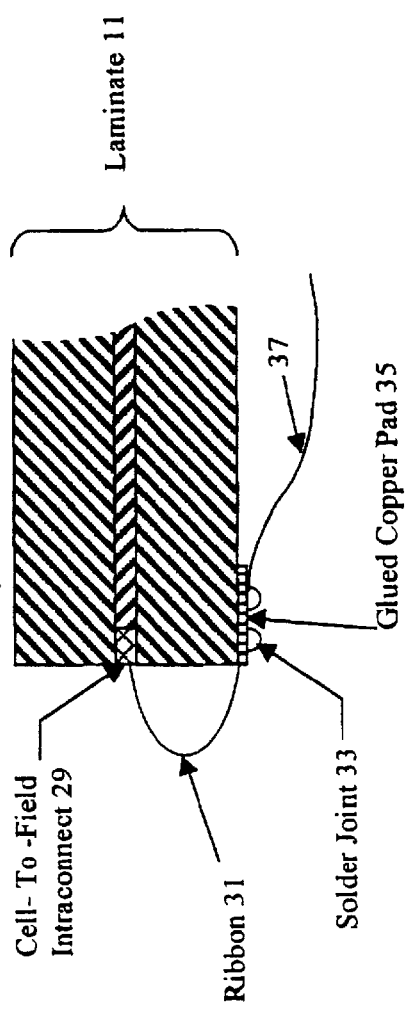

BIFACIAL LIGHTWEIGHT ARRAY FOR SOLAR POWER

REFERENCE TO RELATED APPLICATION

This application claims the priority of U.S. Provisional Application No. 60/020,022, filed Jun. 19, 1996, whose disclosure is hereby incorporated in its entirety into the present disclosure.

FIELD OF THE INVENTION

The present invention is directed to an array of solar cells with two faces for taking advantage of albedo and in particular to such an array that is usable either in space or on the earth.

DESCRIPTION OF PRIOR ART

Conventional solar arrays, such as conventional photovoltaic (PV) arrays, have only one active side and thus waste light reflected onto their back sides through albedo. Terrestrial albedo is generated by the reflection of the incident solar radiation by the surroundings of the PV panel, such as sand, snow, water, rocks, grass, and buildings. Space albedo is generated by the reflection of the incident solar radiation by the earth's surface, atmosphere, and clouds.

SUMMARY OF THE INVENTION

An object of the invention is to provide a novel solar array configuration that uses light reflected through albedo.

Another object of the invention is to provide a solar array that uses light reflected through albedo while providing a high equivalent module efficiency on earth and high equivalent specific power (w/kg) in space.

To achieve these and other objects, the present invention is directed to a solar cell array comprising: a cell panel having front and back sides, both of the front and back sides for receiving electromagnetic energy and for converting the electromagnetic energy into a desired form of energy; a frame having an opening for receiving the cell panel and for allowing the electromagnetic energy to reach both of the front and back sides of the cell panel when the cell panel is disposed in the opening; tension means for applying a tensile force to the cell panel to hold the cell panel in the opening; and means for drawing the desired form of the energy from the cell panel to a location outside the solar cell array.

An exemplary embodiment of the invention features an extremely rigid and rugged carbon composite frame that is also very light-weight. The solar panel is provided in the form of a laminate that includes an array of bifacial cells sandwiched between two thin dielectric cover sheets. The laminate is supported in the frame by a coarse mesh of high tensile cords configured like the strings of a tennis racket. Any movements of the laminate in the plane of the frame are eliminated by the cross-over of the tension cords at the edges of the laminate.

The bifacial cells can be any suitable cells, such as thin GaAs or silicon cells. A particularly useful type of cell, and one used in the exemplary embodiment, is the single crystal, dendritic web silicon solar cell developed originally by Westinghouse.

The present invention makes effective use of recent developments in solar cell technology and in composite materials science to provide high efficiency and light weight.

BRIEF DESCRIPTION OF THE DRAWINGS

The exemplary embodiment of the invention will now be set forth in detail with reference to the drawings, in which:

FIG. 5 shows a perspective view of the solar cell array of FIG. 4;

FIG. 6A shows a cross-sectional view of the laminate containing the solar cells used in the solar cell array of FIGS. 4 and 5;

FIG. 6B shows an electrical connection at an end of the laminate of FIG. 6A;

DETAILED DESCRIPTION OF THE EXEMPLARY EMBODIMENT

Figure 1:
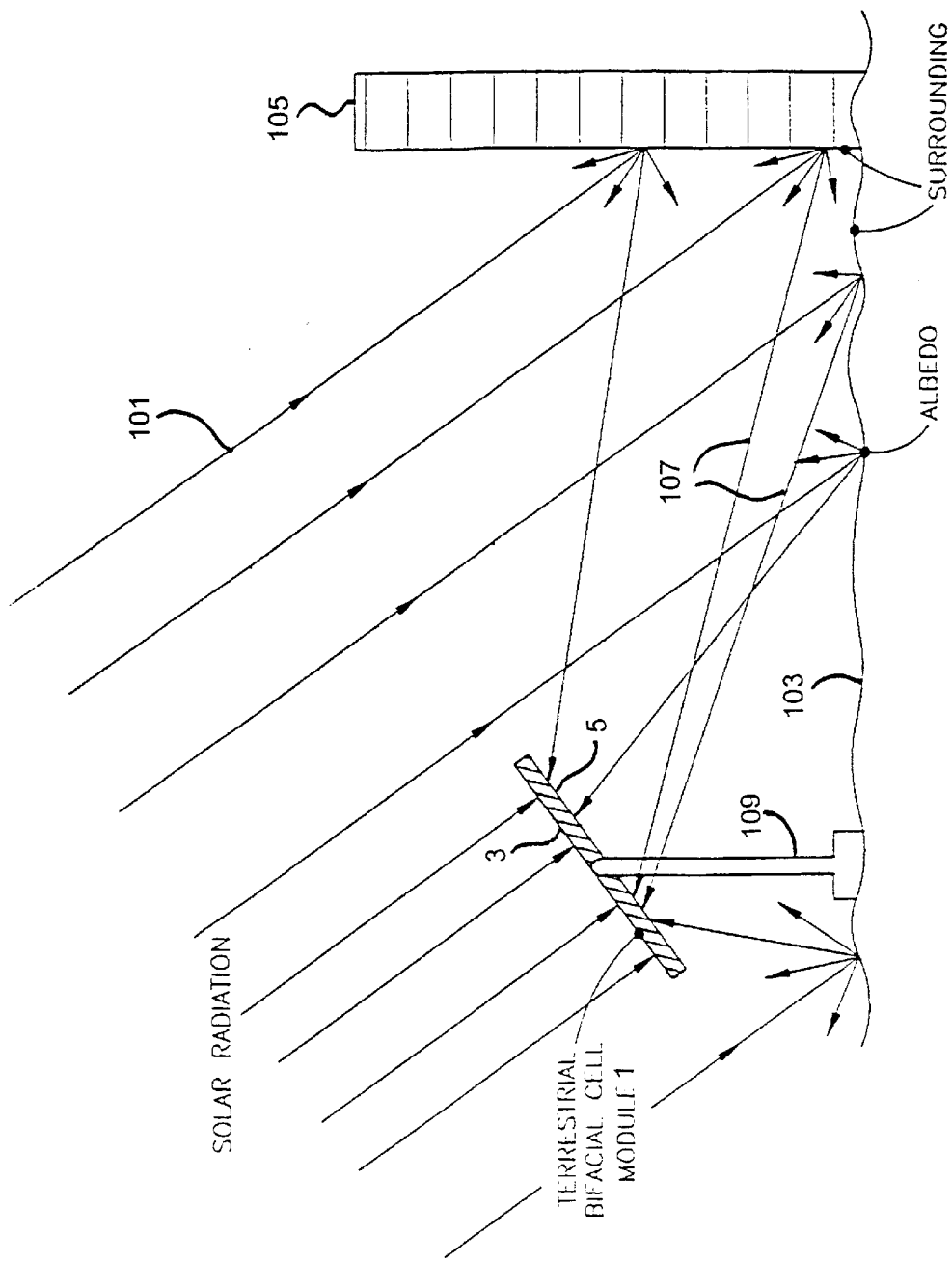
FIG. 1 shows a solar cell array according to the present invention in a terrestrial application.
Figure 2:
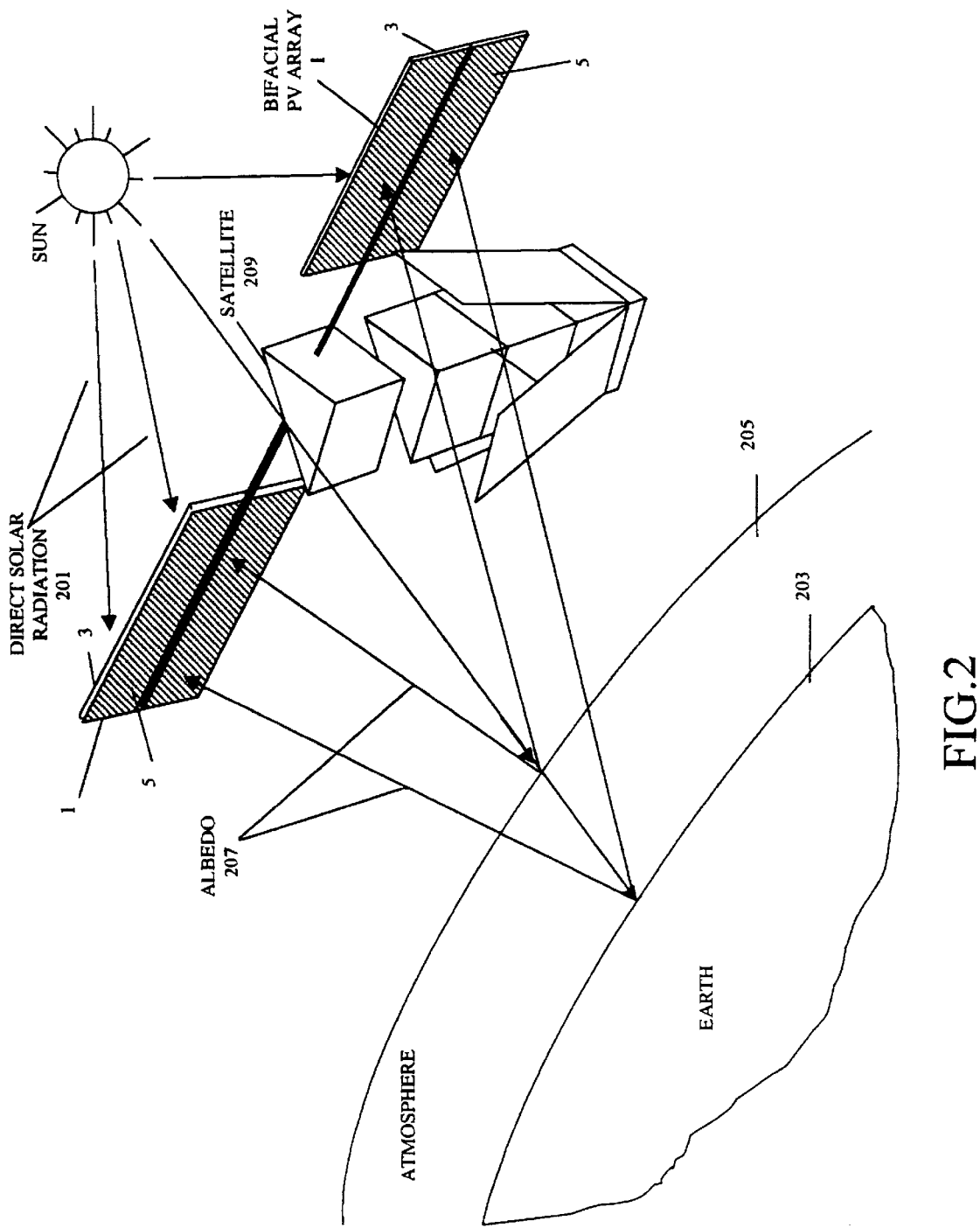
FIG. 2 shows a solar cell array according to the present invention in a space application.
Figure 3:
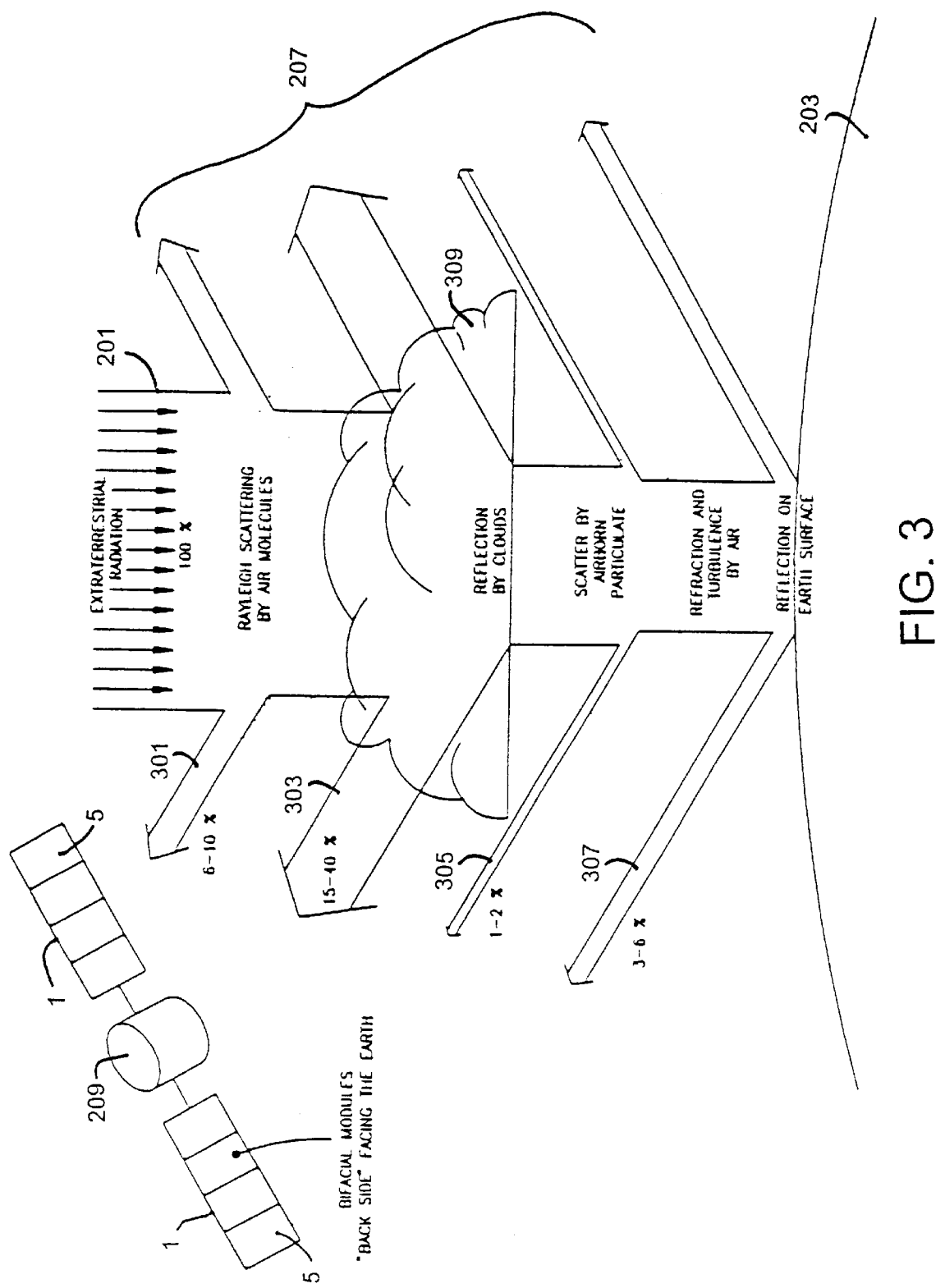
FIG. 3 shows sources of albedo in space and the use of such albedo by a solar cell array according to the present invention.

FIGS. 1–3 show the basic principle of the invention and the manner in which a solar cell array according to the invention makes use of albedo. FIG. 1 shows the solar cell array in a terrestrial application, while FIGS. 2 and 3 show the solar cell array in a space application.

As shown in FIGS. 1–3, solar cell array 1 includes front side 3 and back side 5, both of which can be used to convert radiation such as solar radiation into electric energy or other useful energy. Front side 3 and back side 5 are designated thus for convenience in explanation and not to indicate any necessary structural difference between the two, as the sides can be made to be identical or different as needed.

FIG. 1 shows solar cell array 1 in a terrestrial application. Front side 3 receives and converts solar radiation 101 incident directly thereon. Solar radiation 101 not incident on solar cell array 1 falls on surroundings such as ground 103 and wall 105 and is reflected thereby to produce terrestrial albedo radiation 107. That part of terrestrial albedo radiation 107 that is incident on back side 5 of solar cell array 1 is also converted. Solar cell array can be mounted on a suitable mount such as mount 109.

Terrestrial albedo is strongly dependent on the nature of the environment. For example, albedo due to large bodies of water is about 8 to 10%, whereas the albedo due to fresh snow can be higher than 70%. White painted surfaces close to back side 3 of solar cell array 1 have been shown to increase the performance of the array by about 45%. Early experiments with dendritic web solar cells, which are described in detail below, indicated that white sand could increase the performance of a 12 to 13% cell to an equivalent 19% cell. Because of the constant changes in the environment due to seasons and the like, the terrestrial albedo changes constantly. Nonetheless, an average power output increase due to albedo in the order of 15 to 20% is a realistic assumption.

FIGS. 2 and 3 show solar cell array 1 in a space application. In this particular space application, two solar cell arrays 1 are used, although any number from one on can be used as needed. Front sides 3 receive and convert solar radiation 201 incident directly thereon. Solar radiation 201 not incident on solar cell arrays 1 falls on the earth 203 or its atmosphere 205 and is reflected thereby to produce space albedo radiation 207. That part of space albedo radiation 207 that is incident on back sides 5 of solar cell arrays 1 is also converted. Solar cell arrays 1 can be mounted on a suitable space platform such as satellite 209.

FIG. 3 shows in greater detail the various components of space albedo radiation 207 and typical values of the contributions for these various components. Of extraterrestrial radiation 201 incident on the earth's atmosphere, 6–10% is reflected through Rayleigh scattering by air molecules to form first component 301. Another 15–40% is reflected by clouds 309 to form second component 303. Another 1–2% is scattered by airborne particulate matter to form third component 305. Another 3–6%, after having been subjected to refraction and turbulence by the air, is reflected by the surface of earth 203 to form fourth component 307.

Space albedo as seen by a satellite in a near earth orbit, like terrestrial albedo, is highly variable throughout the year. Although orbital average values can be used in most instances, the value of albedo varies significantly in accordance with such factors as the type of terrain, season, latitude, and cloud cover. For a near-earth orbit, a mean-orbital, seasonal average value of albedo of 30% has been verified by data taken from satellites in orbit.

Figure 4:
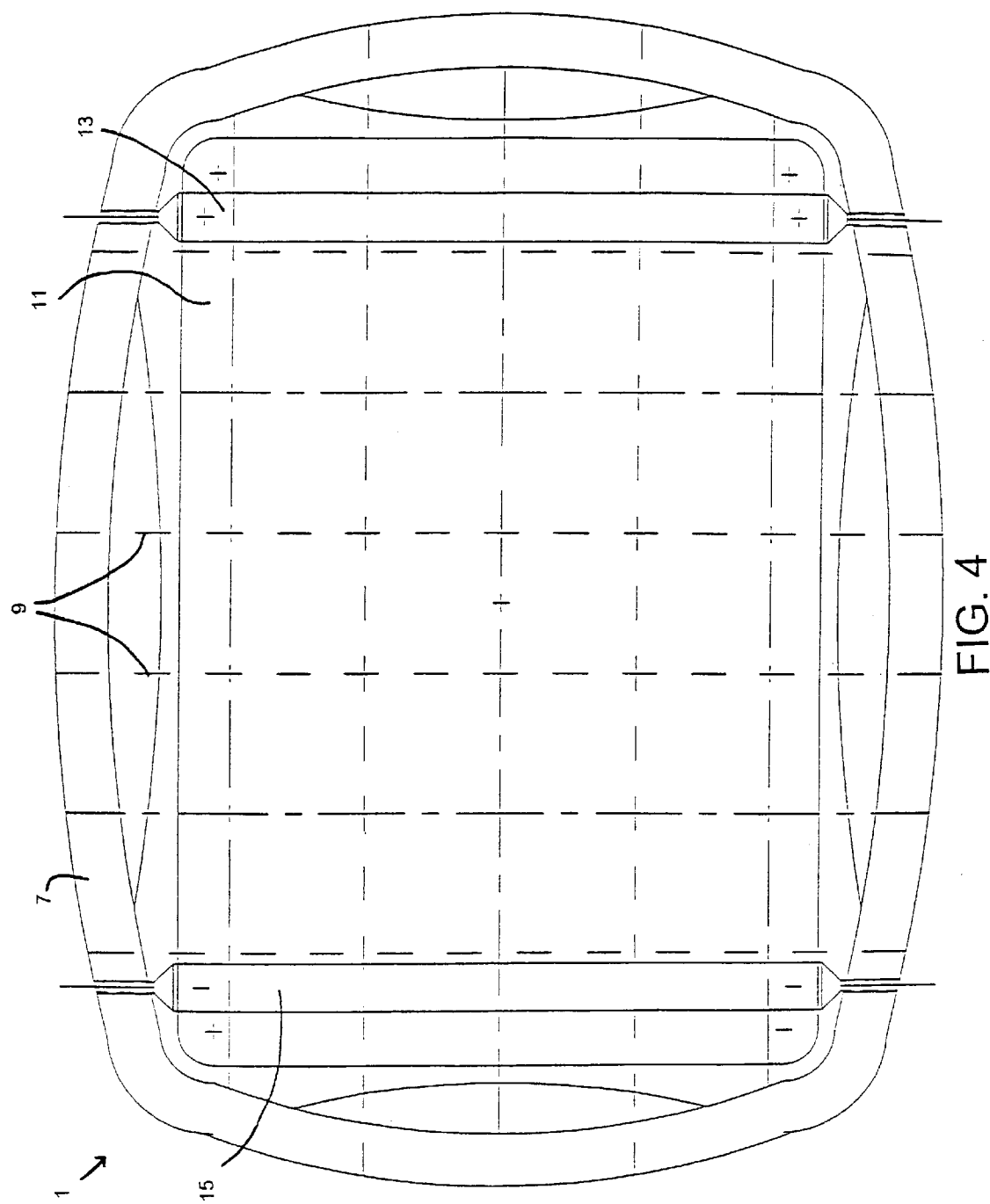
FIG. 4 shows a top view of a solar cell array according to the present invention.

FIGS. 4 and 5 show a top view and a perspective view, respectively, of solar cell 1. In this exemplary embodiment, front side 3 and back side 5 are sufficiently similar in structure that they will not be distinguished in the description of FIGS. 4 and 5.

The main structural support component of solar cell array 1 is hollow carbon composite frame 7. This frame is chosen because it is extremely rugged, rigid, and light. High tensile cords 9, which can be made from Kevlar, are strung from frame 7 like the strings of a tennis racket to support laminate 11, which contains the bifacial solar cells and will be described in detail below. Photovoltaic power generated by the bifacial solar cells in laminate 11 is drawn off by positive electrode 13 and negative electrode 15. Frame 7 is provided with feed-through grommets 17 to allow the stringing of high tensile cords 9 and with electrically insulated power feed-throughs 19 and 21 to allow electrical contact between electrodes 13, 15 and systems external to solar cell array 1 that use power from solar cell array 1. Tension cords 9 allow the elimination of a structural substrate that is conventionally used to provide support for the cells and rigidity for the solar cell array.

FIGS. 6A and 6B show the structure of laminate 11. In laminate 11, bifacial cells 23 are held between top glass panel cerium doped glass micro-sheet 25 and bottom glass panel cerium doped glass micro-sheet 27. Each end of the array of bifacial cells 23 has a cell-to-field interconnect 29 used to draw power. From cell-to-field interconnect 29, ribbon 31 extends to solder joint 33 on glued copper pad 35, which functions as one of electrodes 13, 15. Glued copper pad 35 also has electrical cable 37 soldered thereto to connect glued copper pad 25 to a junction box (not shown) in a system that draws power from solar cell array 1.

Bifacial cells 23 can be made in any available manner. One technique for making bifacial cells 23 is the dendritic web technique, used by EBARA Solar, Inc., of Pittsburgh, Pa., to make bifacial cells. In the dendritic web technique, a silicon dendrite is dipped into molten silicon, and the melt temperature is gradually reduced. Under these conditions, the seed propagates across the surface of the melt, forming a "button." As the button is pulled away from the melt surface, secondary seeds propagate from the extremities of the button in to the melt. As withdrawal continues, a film or "web" of silicon is forms between the dendrites and freezes into a single crystal. The resulting ribbons are nominally 120 microns thick and 5 cm wide and have been grown as long as 17 meters. With changes in the pulling conditions, ribbons as thin as 50 microns can be fabricated.

Dendritic web cell manufacturing requires no slicing or surface preparation other than wet chemical cleaning. The silicon usage is a small fraction of that required by other crystalline growth methods. Cells made by this technique generate electric power nearly as efficiently from light incident on the back as they do from light incident on the front.

Figure 7A:
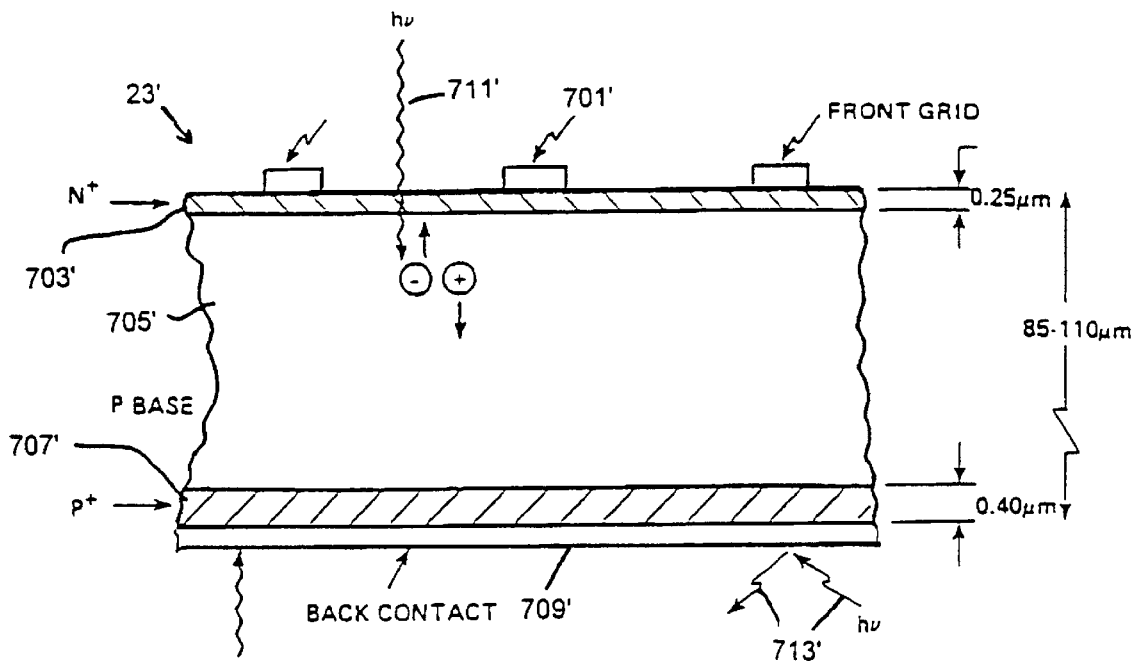
FIG. 7A shows a cross-sectional view of a solar cell according to the prior art.
Figure 7B:
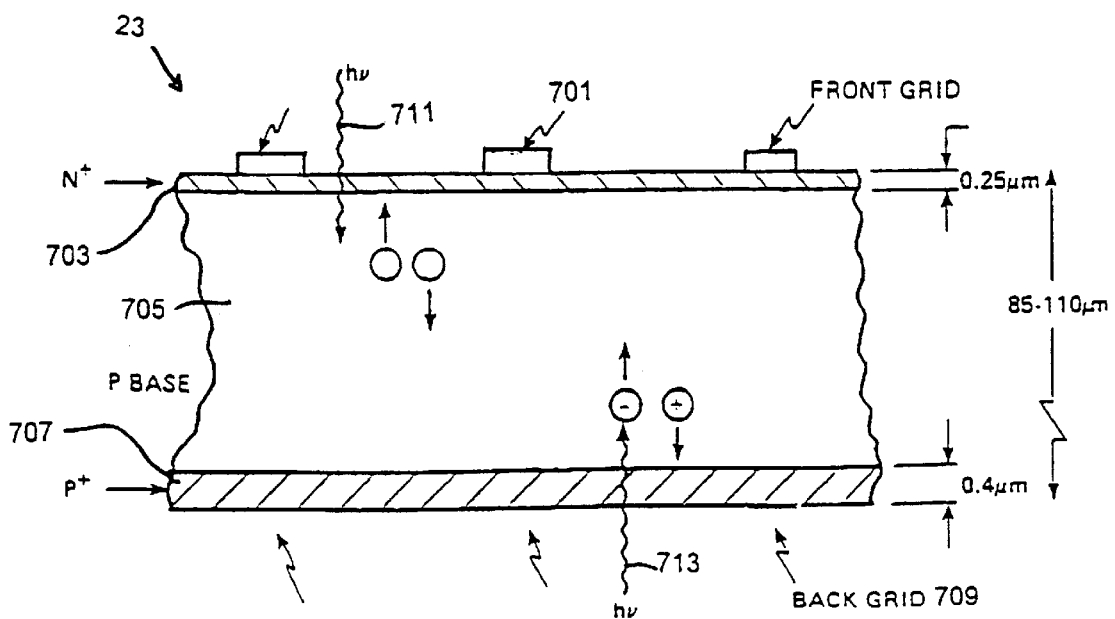
FIG. 7B shows a cross-sectional view of a solar cell used in the present invention.

Such a solar cell will now be compared to a single-sided solar cell of the prior art with reference to FIGS. 7A and 7B, which show cross-sectional views of solar cells according to the prior art and the exemplary embodiment of the present invention, respectively. Corresponding components of the cells will be designated by primed reference numerals for the prior-art cell and by the same reference numerals without the primes in the cell used in the exemplary embodiment.

As shown in FIG. 7A, prior-art solar cell 23' includes front grid 701', N+ layer 703' that is 0.25 $\mu$m thick, P base 705', P+ layer 707' that is 0.40 $\mu$m thick, and back contact 709'. N+ layer 703 ', P base 705', and P+ layer 707' have a total thickness between 85 and 110 $\mu$m. Because front grid 701' takes the form of a grid, light 711' incident from the front enters cell 23' and is converted. On the other hand, because back contact 709' extends solidly across the back of cell 23', light 713' incident from the back is reflected or absorbed and either way is not converted. By way of comparison, as shown in FIG. 7B, solar cell 23 used in the exemplary embodiment has front grid 701, N+ layer 703, P base 705, and P+ layer 707 that are basically similar to the corresponding layers 701', 703', 705', and 707' in prior-art solar cell 23'. Nonetheless, instead of solid back contact 709', solar cell 23 uses back grid 709. Thus, both light 711 incident from the front and light 713 incident from the back can enter the cell and be converted.

The value of the performance increase due to the use of albedo can be expressed in terms of the achieved reduction in the module cost factor measured in dollars/watt, namely, the reduced cost of installed or deployed electric power to the consumer. This quantity is most important for both terrestrial and the space applications, as it determines the economical competitiveness of solar electricity versus other sources of power.

For a space application, the critical parameters that determine the cost of electricity to a large extent are specific power [w/kg], specific stowage volume [W/m$^3$], and specific power density [W/m$^2$]. The major driver behind these parameters is the module conversion efficiency, which is calculated by dividing the total electric output power of the module by the solar power incident on the module. In the present invention, this quantity is replaced by an equivalent efficiency that considers the albedo contribution to the total electric output power. The equivalent efficiency, EQ, is expressed by the following equation:

$$EQ = \frac{P(out)}{P(in)} = \frac{(Ef \cdot AF \cdot In + Eb \cdot Ab \cdot Ia) \cdot Cr}{In \cdot Af}$$

where
P(in) = direct solar power intercepted by front side 3 [W];
P(out) = electrical power output [W];
Ef, Af = module front side efficiency [dimensionless] and surface area [cm$^2$];

Eb, Ab=module back side efficiency [dimensionless] and surface area [cm$^2$];
In=solar radiation intensity incident on front side 3 [W/cm$^2$]
Ia=average albedo radiation intensity on back side 5 [W/cm$^2$]; and
Cr=correction factor due to increased concentration [dimensionless].

In a case in which Ef=14%, Af=Ab, Eb=0.97 Ef Ia =0.32 In, and Cr =1.0075, the equation set forth above gives EQ =18.46%. That is, the relative performance increase due to the use of albedo is about 32%. In other words, a solar cell array according to the present invention will produce about 32% more electricity than a one-side solar cell array having the same nominal efficiency of 14%. Given that solar cells can cost as much as $26.04 per square centimeter and that a satellite can require a solar cell array as large as 59 m$^2$, this increase in efficiency translates into large cost savings.

While an exemplary embodiment of the present invention has been set forth above, those skilled in the art who have reviewed the present disclosure will readily appreciate that modifications may be made without departing from the invention. For example, any type of bifacial cell can be used, as can any suitable material for the frame and the tensile cords. The frame may be solid, hollow, or filled with foam and can be of any shape appropriate for the intended use. The surface of the frame may be treated with radiation or may be coated with a polymer, a metallic film, or both. The cords may be metallic or polymeric; in either event, they may be coated with a conductive or other material resistant to whatever environmental hazards they will encounter in the intended use. Moreover, even though alternatives may be disclosed separately, they may be combined as needed. Therefore, the present invention should be construed as limited only by the appended claims.

I claim:

1. A solar cell array comprising:
    a cell panel having front and back sides, both of the front and back sides receiving electromagnetic energy and for converting the electromagnetic energy into a desired form of energy;
    a frame having an opening for receiving the cell panel and for allowing the electromagnetic energy to reach both of the front and back sides of the cell panel when the cell panel is disposed in the opening;
    tension means secured to the frame in the opening for applying a tensile force to the frame and for securing the cell panel in the opening; and
    means for drawing the desired form of the energy from the cell panel to a location outside the solar cell array.

2. A solar cell array as in claim 1, wherein:
    the desired form of energy is electrical energy; and
    the means for drawing comprises at least two electrodes that are electrically connected to the cell panel to allow the electrical energy to be drawn through the at least two electrodes to the location outside the solar cell array.

3. A solar cell array as in claim 2, wherein the cell panel comprises a plurality of bifacial solar cells.

4. A solar cell array is in claim 3, wherein the plurality of bifacial solar cells comprises a plurality of dendritic web solar cells.

5. A solar cell array as in claim 4, wherein the cell panel further comprises:
    a first panel, transparent to the electromagnetic energy, for covering the plurality of bifacial solar cells and for defining the front side; and
    a second panel, transparent to the electromagnetic energy, for covering the plurality of bifacial solar cells and for defining the back side.

6. A solar cell array as in claim 5, wherein each of the first and second panels is made of a dielectric material.

7. A solar cell array as in claim 1, wherein the tension means comprises a plurality of high tensile cords attached to the frame and extending into the opening.

8. A solar cell array as in claim 1, wherein the tensioning means comprises a plurality of high tensile cords attached to the frame and extending across the opening for engaging the front and back sides of the cell panel.

9. The solar cell array as in claim 1, wherein the opening lies in a plane of the frame which includes arcuate portions having outwardly extending concave portions lying in the plane of the frame, and wherein tensioning means extends between the arcuate sections.

10. The solar cell array as in claim 9, wherein the arcuate portions form a rectangular like structure.

11. A solar power system comprising:
    (a) a solar cell array comprising:
        (i) a cell panel having front and back sides, both of the front and back sides for receiving electromagnetic energy and for converting the electromagnetic energy into a desired form of energy;
        (ii) a frame having an opening for receiving the cell panel and for allowing the electromagnetic energy to reach both of the front and back sides of the cell panel when the cell panel is disposed in the opening;
        (iii) tension means secured to the frame for applying a tensile force thereto and for securing the cell panel in the opening; and
        (iv) means for drawing the desired form of the energy from the cell panel to a location outside the solar cell array; and
    (b) support means for supporting the solar cell array so that a first portion of the electromagnetic energy is incident directly on the front side and a second portion of the electromagnetic energy is reflected through albedo by an environment in which the solar power system is disposed and is incident on the back side.

12. A solar power system as in claim 11, wherein:
    the electromagnetic energy comprises sunlight; and
    the support means supports the solar cell array so that at least part of the sunlight is directly incident on the front side.

13. A solar power system as in claim 12, wherein the support means is attached to the earth.

14. A solar power system as in claim 12, wherein the support means is a satellite.

* * * * *